(12) United States Patent
Lee et al.

(10) Patent No.: US 6,249,414 B1
(45) Date of Patent: Jun. 19, 2001

(54) DISPLACEMENT CURRENT TRIGGER SCR

(75) Inventors: Jian-Hsing Lee; Jiaw-Ren Shih; Yi-Hsun Wu; Jing-Meng Liu, all of Hsin-Chu (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 09/670,404

(22) Filed: Sep. 28, 2000

Related U.S. Application Data

(63) Continuation of application No. 09/292,362, filed on Apr. 15, 1999.

(51) Int. Cl.[7] .................................................. H02H 3/22
(52) U.S. Cl. .................................. 361/111; 257/360
(58) Field of Search ........................... 361/54, 56, 111, 361/88; 257/355, 356, 360, 361, 367, 379; 327/309, 310, 306

(56) References Cited

U.S. PATENT DOCUMENTS

| 5,400,202 | 3/1995 | Metz et al. ............................ 361/56 |
| 5,452,171 | 9/1995 | Metz et al. ............................ 361/56 |
| 5,528,188 | 6/1996 | Au et al. .............................. 327/310 |
| 5,541,801 | 7/1996 | Lee et al. .............................. 361/56 |
| 5,572,394 | 11/1996 | Ker et al. ............................. 361/56 |
| 5,576,557 | 11/1996 | Ker et al. ............................ 257/173 |
| 5,682,047 | * 10/1997 | Consiglio ........................... 257/335 |
| 5,719,733 | 2/1998 | Wei et al. ........................... 257/173 |
| 5,742,085 | 4/1998 | Yu ...................................... 257/360 |
| 5,744,842 | 4/1998 | Ker ..................................... 257/362 |
| 5,754,380 | 5/1998 | Ker et al. ............................. 361/56 |
| 5,754,381 | 5/1998 | Ker ...................................... 361/56 |
| 5,767,537 | * 6/1998 | Yu et al. ............................. 257/111 |
| 5,959,821 | * 9/1999 | Voogel ................................ 361/111 |

* cited by examiner

*Primary Examiner*—Michael J. Sherry
*Assistant Examiner*—Kim Huynh
(74) *Attorney, Agent, or Firm*—Stephen B. Ackerman; George O. Saile

(57) ABSTRACT

Circuits, device structures and methods are disclosed which protect CMOS semiconductor devices, having oxides as thin as 32 Angstrom, from electrostatic discharge (ESD) by utilizing a parasitic silicon controlled rectifier (SCR), intrinsic to the semiconductor device. The protection is afforded by providing low voltage triggering of the parasitic SCR in the order of 1.2 Volt. Triggering at such low voltages is made possible by means of a displacement current trigger which causes components of the SCR (parasitic npn and pnp bipolar transistors) to conduct, i.e., to trigger the SCR. The displacement current is realized by a junction capacitance, which is connected on one side to the pad to be protected and on the other side to terminals of the aforementioned parasitic bipolar transistors. Two ways of realizing the junction capacitance are disclosed.

9 Claims, 7 Drawing Sheets

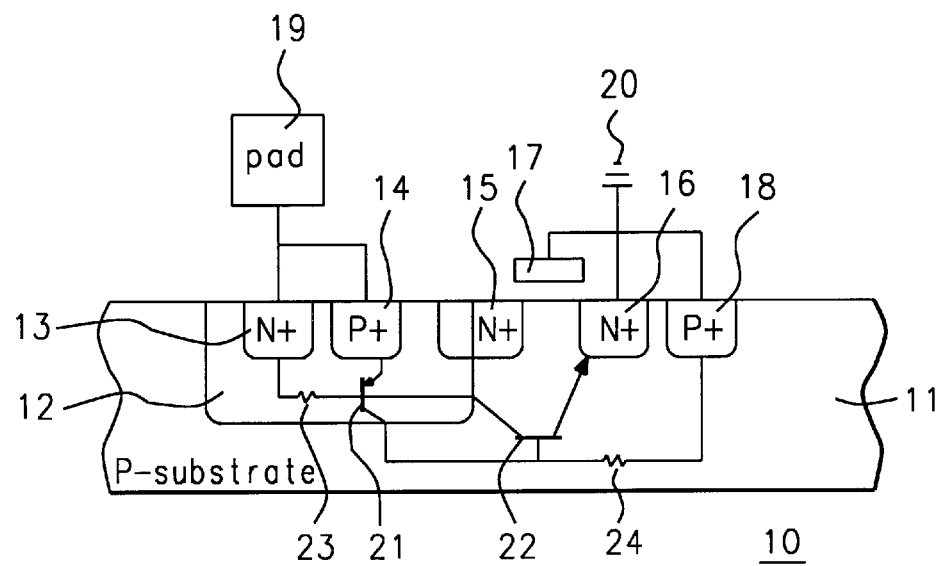
FIG. 1 — Prior Art
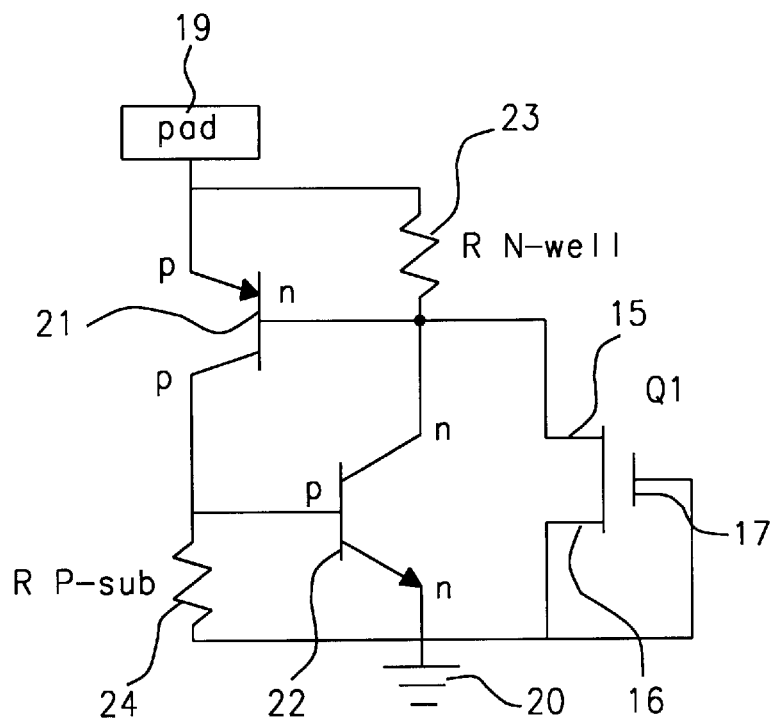
FIG. 2 — Prior Art

DISPLACEMENT CURRENT TRIGGER SCR

This application is a continuation of U.S. application Ser. No.09/292,362 filed Apr. 15, 1999.

BACKGROUND OF THE INVENTION

1. Field of the Invention

The invention relates to the protection of integrated circuits from electrostatic discharge (ESD), and more particularly to a low voltage protection of CMOS circuits by a parasitic silicon controlled rectifier (SCR) which is triggered by a displacement current.

2. Description of the Related Art

The protection of integrated circuits from electrostatic discharge (ESD) is a subject which has received a lot of attention from circuit designers because of the serious damage that ESD can wreak as oxide thicknesses are reduced together with device dimensions. The seriousness of the problem is reflected in the number of articles published and U.S. patents issued. Workers in the field and inventors have proposed many solutions, many trying to solve the problem of protecting sub-micron devices while still allowing them to function unencumbered and without undue, or zero, increase of silicon real estate. The main thrust of ESD protection for CMOS devices is focused on the use of parasitic npn and pnp bipolar transistor, which together form an SCR. Unwanted as this SCR is normally, it can safely discharge dangerous ESD voltages as long as its trigger voltage is low enough to protect those CMOS devices of which it is a part. Past solutions have offered low voltage lateral SCRs (LVTSCR), modified lateral SCRs (MLSCR), PMOS-trigger lateral SCRs (PTLSCR), NMOS-trigger lateral SCRs (NTLSCR), and modified PTLSCRs and NTLSCRs.

FIG. 1 is a cross-sectional view of a typical prior art CMOS structure protected from ESD pulses by an SCR and NMOS transistor. Shown is a semiconductor wafer 10 with CMOS devices, with parasitic bipolar transistors forming an SCR, and an additional NMOS device for lowering the trigger voltage of the SCR. In a p-substrate 11 an n-well 12 is formed, and a p-channel transistor with a p$^+$ source 14 and a p$^+$ drain (not shown) is created. An n$^+$ contact region 13 is formed in the n-well and together with p$^+$ source 14 connected to a voltage supply pad 19. In p-substrate 11 an n-channel transistor with an n$^+$ drain 15, an n$^+$ source 16, and a gate 17 is created. The n$^+$ drain 15 straddles p-substrate 11 and n-well 12. A p$^+$ contact region 18, formed in p-substrate 11, is connected together with n$^+$ source 16 to a reference voltage 20.

The steps that produce the above CMOS structure also create parasitic bipolar pnp transistor 21 between p$^+$ source 14 (emitter), n-well 12 (base), and p-substrate 11 (collector), and parasitic bipolar npn transistor 22 between n$^+$ source 16 (emitter), p-substrate 11 (base), and n-well 12 (collector). The base of transistor 21 is connected via n-well resistor 23 to n$^+$ contact region 13, and the base of transistor 22 is connected via p-substrate resistor 24 to p$^+$ contact region 18. The base of one transistor is connected to the collector of the other transistor. Resistors 23 and 24 are equivalent resistors for the intrinsic resistance of the n-well and p-substrate material. FIG. 2 is the equivalent circuit of FIG. 1 showing the interconnection of transistor 21 and 22 forming an SCR. NMOS transistor Q1 is shunted across npn transistor 22 providing the trigger for the SCR. ESD voltage pulses are shunted from pad 19 via transistors 21 and 22 to reference voltage (ground) 20.

U.S. patents relating to ESD protection are:

U.S. Pat. No. 5,754,381 (Ker) provides a modified PTLSCR and NTLSCR, and bypass diodes for protection of the supply voltage and output pad of an output buffer. The trigger voltage is the low snap-back trigger voltage of a short-channel PMOS (NMOS) device.

U.S. Pat. No. 5,754,380 (Ker et al.) is similar to U.S. Pat. No. 5,754,381 above but without bypass diodes. The invention requires a smaller layout area than conventional CMOS output buffers with ESD protection.

U.S. Pat. No. 5,744,842 (Ker) teaches the use of an ESD protection circuit between $V_{dd}$ and $V_{ss}$, comprising a bipolar transistor and an n-type field-oxide device.

U.S. Pat. No. 5,742,085 (Yu) discloses a low-voltage trigger protection, consisting of two SCRs and an NMOS transistor for triggering disposed between an IC bonding pad and $V_{ss}$.

U.S. Pat. No. 5,719,733 (Wei et al.) presents an ESD protection device using one SCR for deep submicron CMOS devices, where the structure comprises a p-well and an n-well (or p-substrate) that are separated. A ground electrode is connected to a p$^+$ and an n$^+$ contact region and through a polysilicon region to a gate oxide region in the n-well. The triggering voltage for snapback of the SCR is tunable between 5–11 Volts.

U.S. Pat. No. 5,576,557 (Ker et al.) provides ESD protection for sub-micron CMOS devices supplying discharge paths at $V_{dd}$ and $V_{ss}$ using two LVTSCRs. In addition a PMOS device is used in conjunction with one LVTSCR and an NMOS device with the other LVTSCR. Inclusion of the PMOS and NMOS devices allows lowering of the trigger voltage to 11–13 Volt.

U.S. Pat. No. 5,572,394 (Ker et al.) discloses an ESD protection circuit formed by two PTLSCRs and two NTLSCRs for protection from the four modes of ESD. The use of short-channel thin-oxide PMOS (NMOS) devices reduces the turn-on voltage of the lateral SCR to below the gate-oxide breakdown voltage of CMOS devices in the input stage.

U.S. Pat. No. 5,541,801 (Lee et al.) uses three LVTSCRs which are connected between $V_{dd}$, the circuit to be protected, and $V_{ss}$. Each of the SCRs uses a PMOS/NMOS transistor to lower the trigger voltage. The gates of the PMOS/NMOS transistors are each in turn connected via linked terminals of trigger gates to the circuit to be protected.

U.S. Pat. No. 5,452,171 (Metz et al.) describes a protection circuit using an inverter trigger device, with a voltage divider on its output, to control the amount of voltage necessary to cause latchup of the parasitic SCR. An NMOS device is disposed between the output of the trigger device and the SCR.

U.S. Pat. No. 5,400,202 (Metz et al.) is similar to U.S. Pat. No. 5,452,171 above in the use of an inverter trigger device, an NMOS transistor and the parasitic SCR, but does not appear to use the voltage divider.

It should be noted that none of the above-cited examples of the related art have reduced the snapback voltage below 4 Volt. The snapback voltage of a LVTSCR with a short-channel NMOS (or PMOS) of 4 Volt is still too high to protect the internal circuit of 0.18 micron processes, because the oxide thicknesses are in the order of 32 Ångstrom. The related art does not address protection for oxides that thin. What is needed is an SCR with an trigger voltage in the range of 1.2 Volt. This voltage is low enough to prevent internal device damage by ESD pulses. Instead of the breakdown of an NMOS (or PMOS) device utilizing the breakdown of n-well to p-substrate (or p-well) will be proposed.

SUMMARY OF THE INVENTION

It is an object of the present invention to present circuits and methods which protect CMOS semiconductor devices, having oxides as thin as 32 Ångstrom, from electrostatic discharge (ESD).

Another object of the present invention is to utilize a parasitic silicon controlled rectifier (SCR), intrinsic to the semiconductor device, for the protection.

A further object of the present invention is to provide low voltage triggering of the parasitic SCR in the order of 1.2 Volt.

These objects have been achieved by providing a displacement current trigger which causes components of the SCR (parasitic npn and pnp bipolar transistors) to conduct, i.e., to trigger the SCR. The displacement current is realized by a junction capacitance, which is connected on one side to the pad to be protected and on the other side to terminals of the aforementioned parasitic bipolar transistors. Two ways of realizing the junction capacitance are disclosed.

BRIEF DESCRIPTION OF THE DRAWINGS

FIG. 1 is a cross-sectional view of CMOS transistors of the prior art with parasitic bipolar transistors shown schematically.

FIG. 2 is an equivalent circuit diagram of the parasitic bipolar transistors and an NMOS transistor of FIG. 1.

DESCRIPTION OF THE PREFERRED EMBODIMENT

To avoid the high NMOS snapback voltage of low voltage trigger silicon controlled rectifier electrostatic discharge (LVTSCR ESD) protection devices of the prior art, a different circuit and method are proposed. The NMOS snapback voltage, which is greater than 4 Volt, would damage internal MOS structures for a 0.18 micron fabrication process, having an oxide thickness as low as 32 Ångstrom. The invention introduces a junction capacitance to initiate the triggering of the silicon controlled rectifier (SCR).

Briefly, when an electrostatic discharge (ESD) occurs, the displacement current through that junction capacitance produces a current flow which turns on the two parasitic bipolar transistors inherent in a CMOS structure and which together form an SCR. By use of that junction capacitance the SCR typically triggers near 1.2 Volt, low enough to protect those internal MOS structures with an oxide thickness equal to 32 Å or more. The trigger voltage (or operating range) can vary between 1 and 12 Volt depending on variations in the device parameters and zapping voltage. The junction capacitance $C_j$ is formed by an $n^+$ contact region to a p-substrate (or p-well) and provides the displacement current to trigger the SCR and short dangerous ESD voltages to ground (or reference voltage). Because of the low trigger voltage internal device damage by an ESD pulse is prevented.

Figure 3:
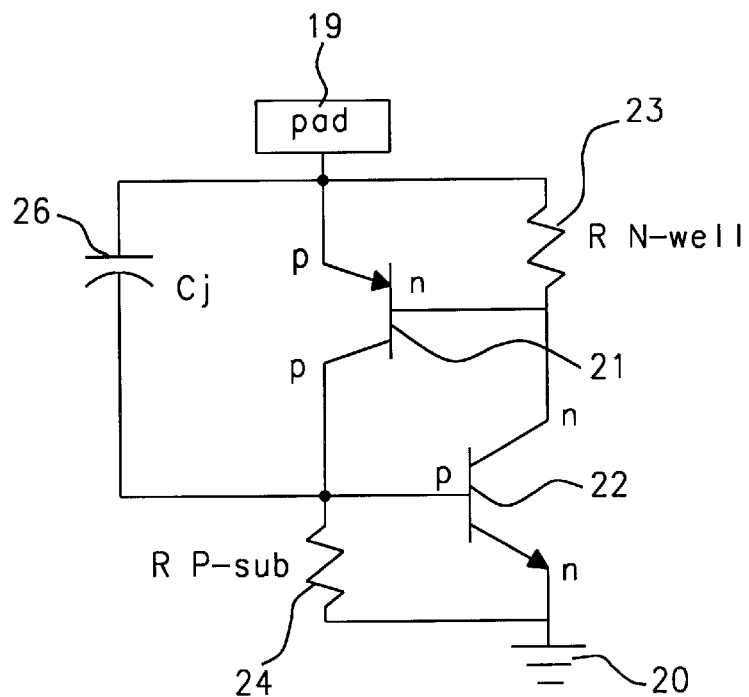
FIG. 3 is an equivalent circuit diagram of the parasitic bipolar transistors similar to FIG. 2, and showing the capacitor of the present invention

When the NMOS transistor Q1 of FIG. 2 is removed and when, as shown in FIG. 3, capacitor 26 (with capacitance $C_j$) is added between pad 19 and point A, the SCR comprised of pnp and npn parasitic transistors 21 and 22 is triggered by the ESD induced surge current and passes that current safely to ground. Note that like numerals in FIGS. 2 and 3 designate the same component. The function and arrangement of components 19 to 24 is the same as described earlier for FIG. 2.

Figure 4:
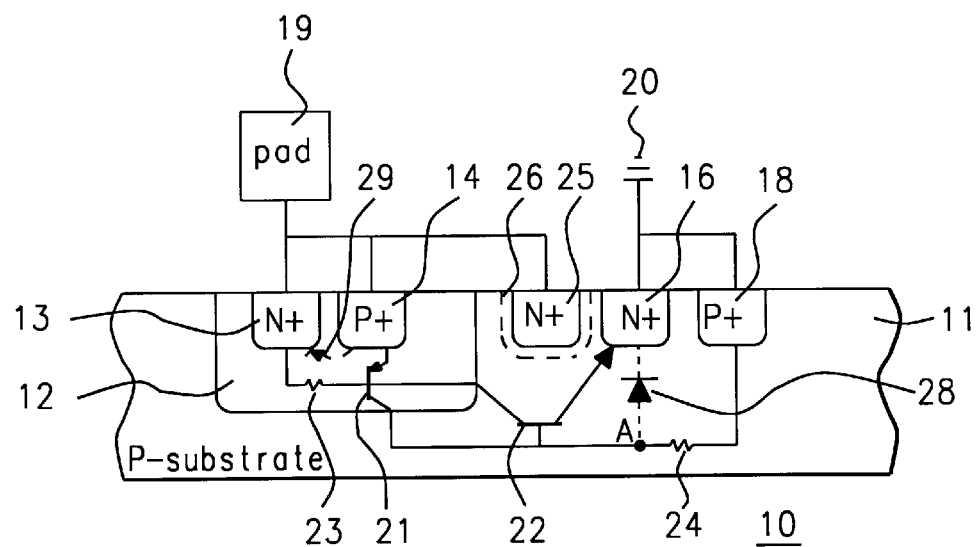
FIG. 4 is a cross-sectional view of CMOS transistors utilizing an n-well of a first preferred embodiment of the present invention showing the components of FIG. 3 and equivalent junction diodes.

We describe now in FIG. 4 a preferred circuit and method for a structure which produces such a displacement current triggered SCR:

1) Forming an n-well 12 in the p-substrate 11 of a semiconductor wafer 10 and creating a p-channel transistor with a $p^+$ source 14 and a $p^+$ drain (the latter not shown) in n-well 12.

2) Creating an n-channel transistor with an $n^+$ source 16 and an $n^+$ drain (the latter not shown) in p-substrate 11.

3) Creating a $p^+$ contact region 18 in p-substrate 11 and connecting $p^+$ contact region 18 and $n^+$ source 16 to a reference voltage 20.

4) Forming a first $n^+$ contact region 13 in n-well 12 and a second $n^+$ contact region 25 in p-substrate 11.

5) Forming a junction capacitor 26 between $n^+$ contact region 25 and p-substrate 11.

6) Connecting $p^+$ source 14 and $n^+$ contact regions 13 and 25 to a voltage supply pad 19.

The steps that produce the above CMOS structure also create parasitic bipolar pnp transistor 21 between $p^+$ source 14 (emitter), n-well 12 (base), and p-substrate 11 (collector), and parasitic bipolar npn transistor 22 between $n^+$ source 16 (emitter), p-substrate 11 (base), and n-well 12 (collector). The base of transistor 21 is connected via n-well resistor 23 to $n^+$ contact region 13, and the base of transistor 22 is connected via p-substrate resistor 24 to $p^+$ contact region 18. The base of one transistor is connected to the collector of the other transistor. The junction between resistor 24 and the base of transistor 22 is labeled Point A. Resistors 23 and 24 are equivalent resistors for the intrinsic, and parasitic, resistance of the n-well and p-substrate (or p-well) material.

When AC current, caused by ESD and flowing through capacitor 26, produces a voltage drop across resistor 24 (Point A) equal to or larger than 0.7 Volt, then the base-emitter junction of npn transistor 22 becomes forward biased acting as an equivalent junction diode (diode 28 in FIG. 4), electrons flow into n-well 12 and are collected by $n^+$ contact region 13. This causes npn transistor 22 to turn on. If the electron current is large enough, then the emitter-base junction of pnp transistor 21 becomes forward biased and acts as an equivalent junction diode (diode 29 in the n-well in FIG. 4). Current (holes) will flow through the n-well, into the p-substrate, to the collector of npn transistor 22 and collect at p⁺ contact region 18. Therefore the pnp transistor 21 turns on, i.e., the SCR fires and the surge current from the ESD is safely conducted from pad 19 to ground 20. The triggering of the SCR can be viewed as the breakdown between n-well 12 and p-substrate 11 (or p-well 30), analogous to the breakdown of the NMOS (or PMOS) device of the prior art.

Figure 5:
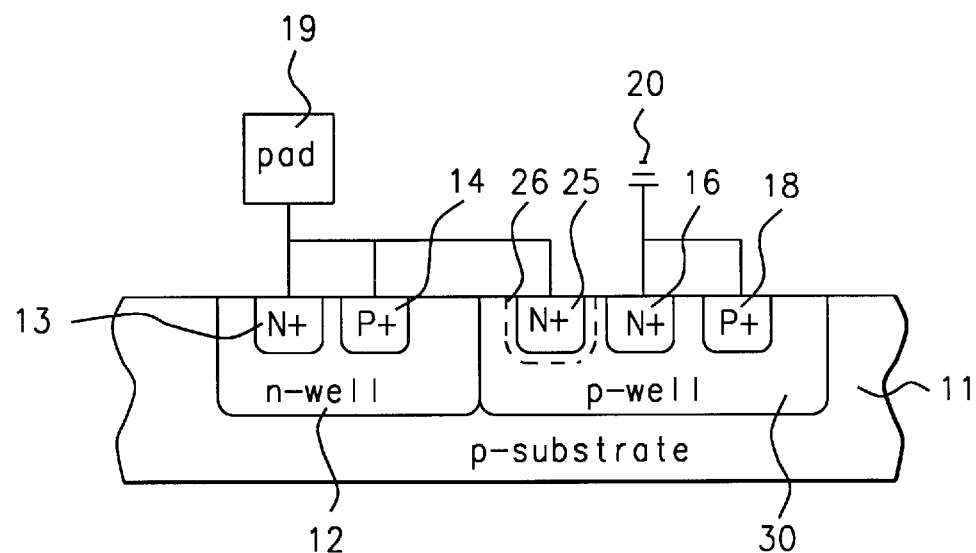
FIG. 5 is a cross-sectional view of CMOS transistors utilizing an n-well and a p-well of a second preferred embodiment of the present invention.
Figure 6:
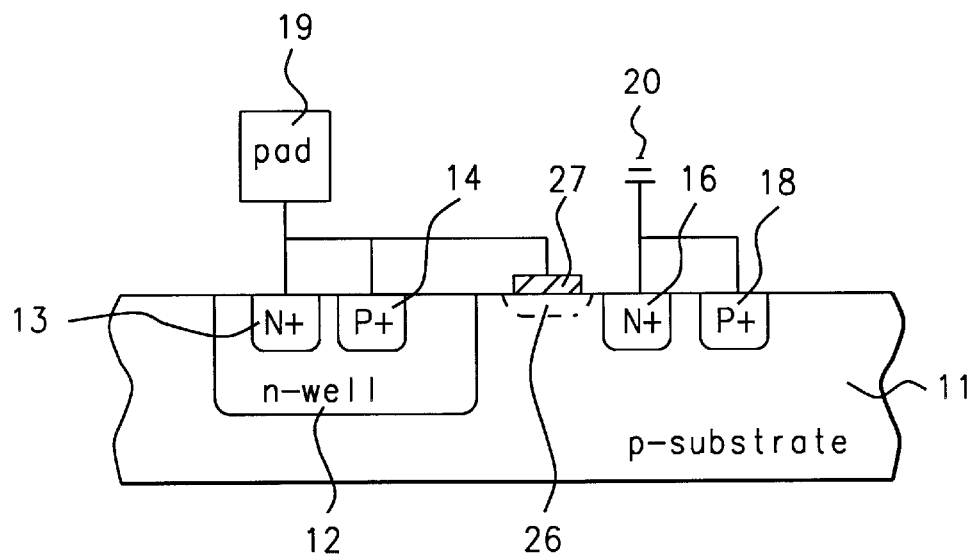
FIG. 6 is a cross-sectional view of CMOS transistors and using a polysilicon capacitor of a third preferred embodiment of the present invention.

A second preferred embodiment of the present invention is depicted in FIG. 5, where elements 16, 18, and 25 are placed in a p-well 30. The arrangement of the parasitic transistors, equivalent junction diodes, and n-well resistors stays the same, except that the p-substrate resistor is replaced by a p-well resistor of the same value. A third preferred embodiment is shown in FIG. 6 and replaces n⁺ contact region 25 with a polysilicon capacitor 27 having the same capacitance $C_j$ as capacitor 26 of n⁺ contact region 25.

Figure 7:
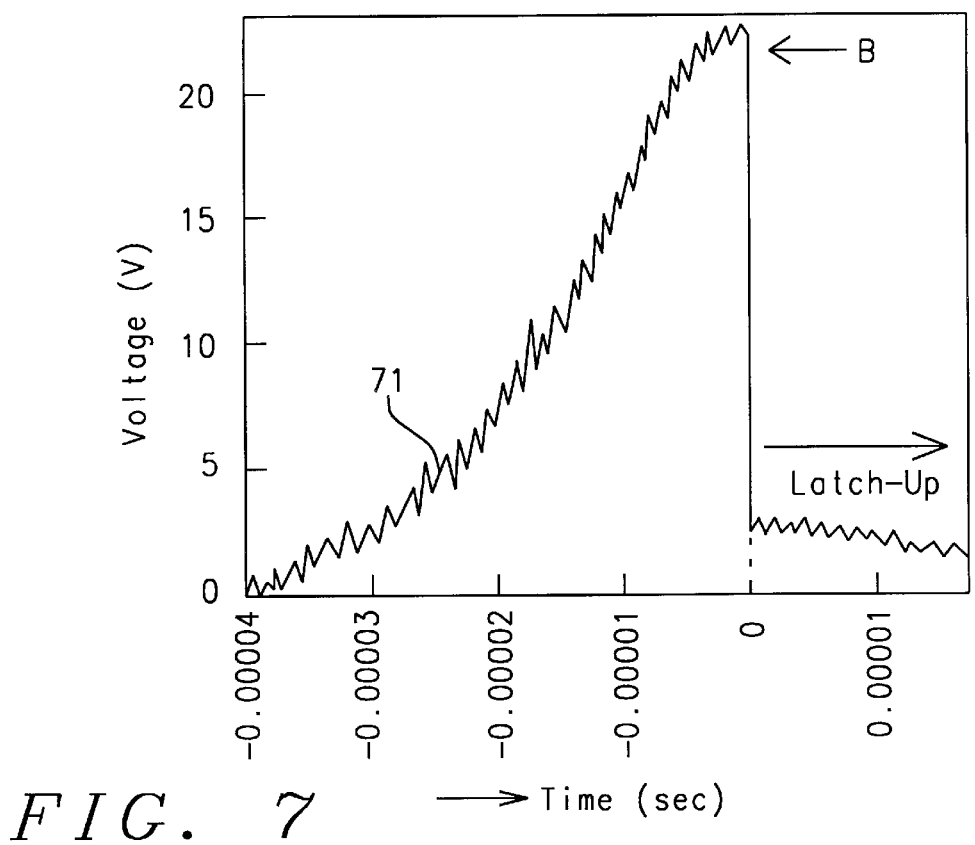
FIG. 7 is a graph of a latch-up test for a typical SCR.

FIG. 7 is a graph of the latch-up test for a typical SCR (pnpn), where Curve 71 depicts the rise of the trigger voltage versus time. When the maximum voltage is reached at Point B (exceeding 20 Volt) and time 0 the SCR fires, the curve drops steeply and the SCR enters latch-up mode, holding at about 2 Volt. A trigger voltage in excess of 20 Volt is too high to protect the typical MOS structure.

Figure 8A:
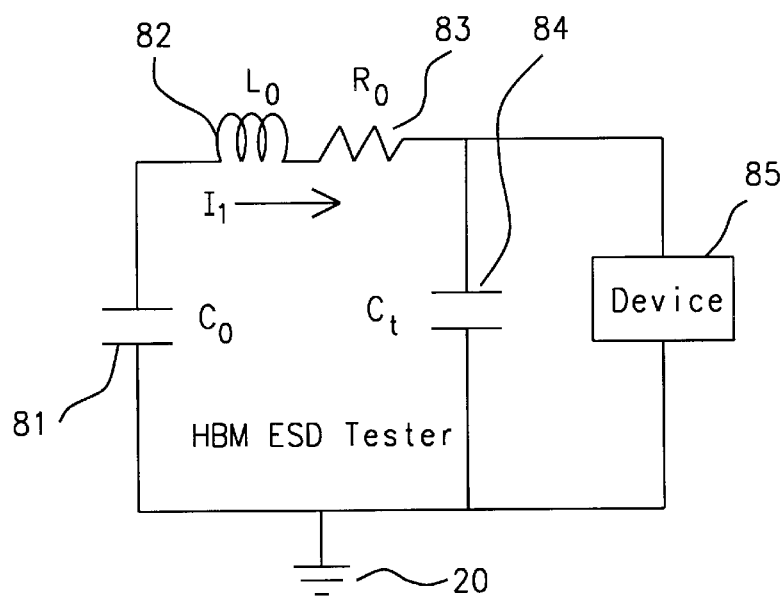
FIGS. 8a–b are equivalent circuit diagrams of a Human Body Model Electrostatic Discharge Tester (HBM ESD Tester).

In FIG. 8a we show the circuit equivalent of a human body model for an electrostatic (HBM ESD) tester. This circuit allows the modeling of electrostatic discharge energy as represented by capacitor 81 with a capacitance of $C_0$ as it affects a device 85, the test subject. Part of the model is inductor 82 (with inductance $L_0$) in series with a resistor 83 (with resistance $R_0$) driven by a current $I_1$. Capacitor 84 (with test-board capacitance $C_t$) models the decay time of the voltage as seen across device 85, i.e., the model of the SCR.

Figure 8B:
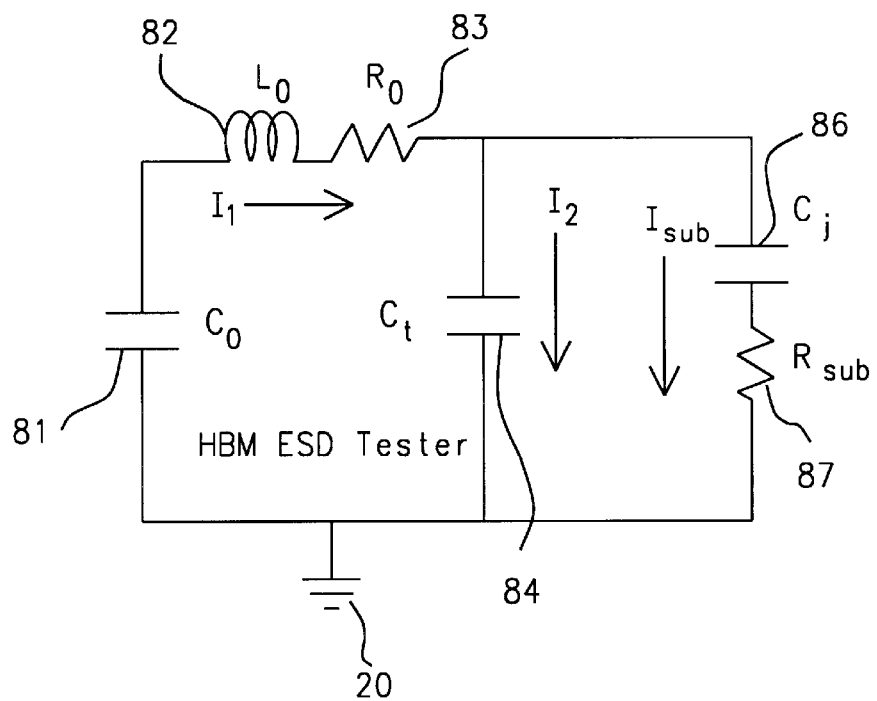

FIG. 8b is the same circuit as that of FIG. 8a, but shows the invention's circuit equivalent before the SCR turns on. The impressed voltage V with current $I_1$ causes the circuit to ring since it contains inductive and capacitive components and, thus, models an electrostatic discharge. Current $I_1$ splits into two branches with current $I_2$ flowing through capacitor 84 and current Isub flowing through capacitor 86 (with capacitance $C_j$ modeling the junction capacitance of capacitor 26) and resistor 87 (with resistance $R_{sub}$) modeling the p-substrate (or p-well) resistance of resistor 24.

The magnitude of the substrate current $I_{sub}$ is critical, because if it is too small the SCR will not turn on, but once the product of $I_{sub}$ and $R_{sub}$ is equal or larger than 0.7 Volt the SCR will turn on, i.e., fire. $I_{sub}$ is determined by the following equation:

$$I_{sub} = \frac{V_0 C_j}{2\beta L_0 (C_j + C_t)}[\exp((-\alpha + \beta)t) - \exp(-(\alpha + \beta)t)]$$

$$\text{where: } \alpha = \frac{R_0}{2L_0}$$

$$\beta = \frac{\sqrt{R_0^2 - 4L_0\left(\frac{1}{C_0} + \frac{1}{C_j} - \frac{C_t}{C_j(C_j + C_t)}\right)}}{2L_0}$$

Figure 9A:
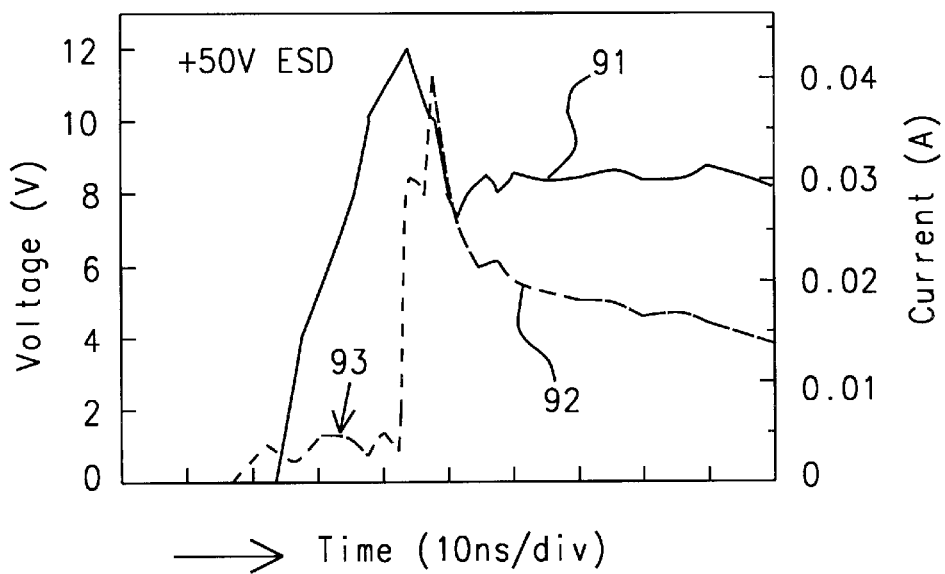
FIGS. 9a–c are graphs of the HBM Real-time I–V Characteristic of an NMOS device for three different ESD voltages.
Figure 9B:
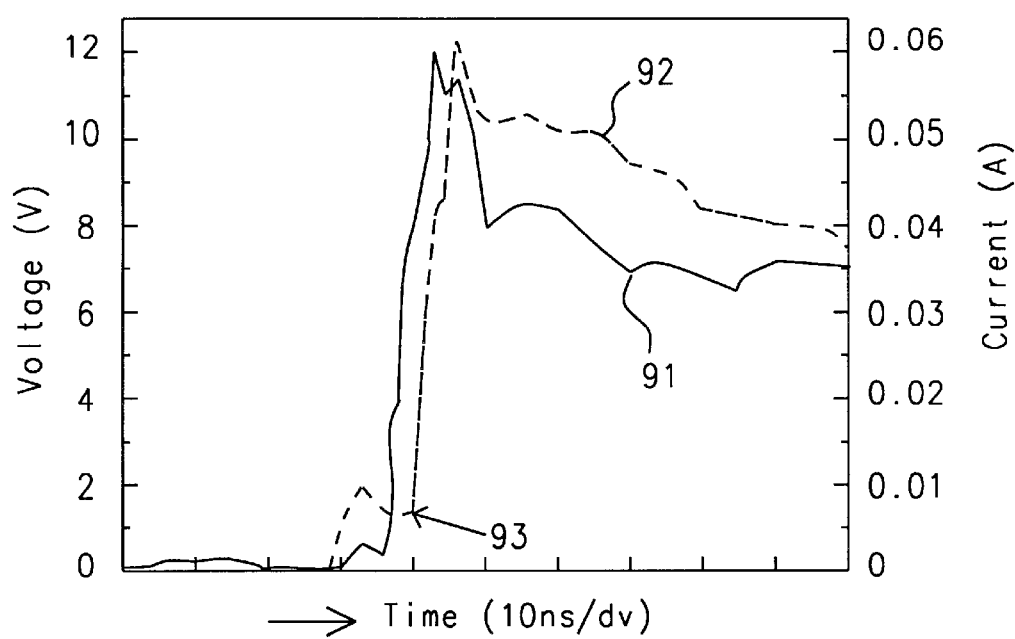
Figure 9C:
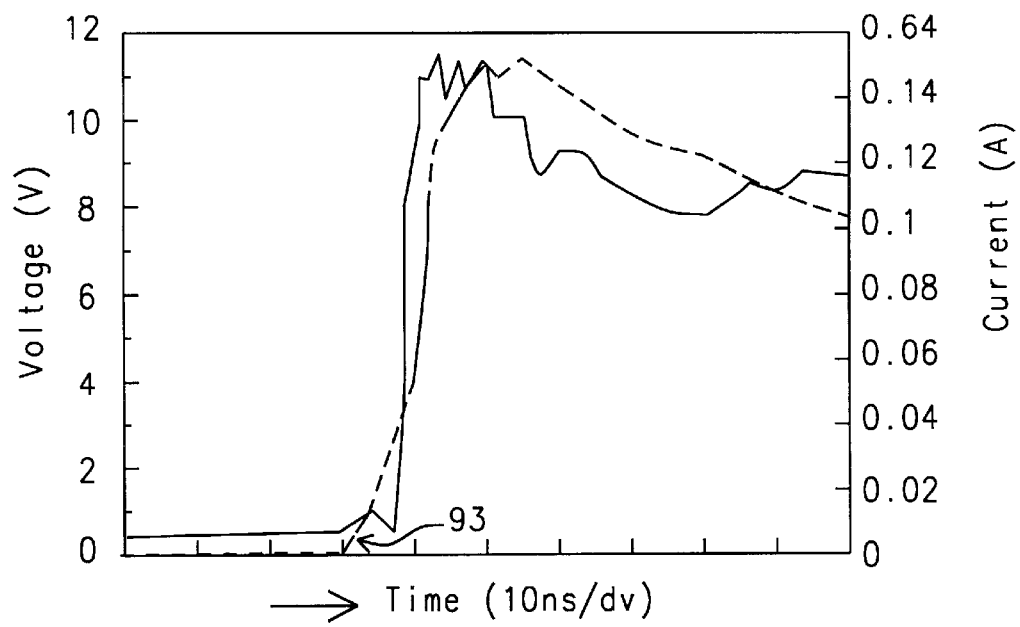

Next we show in FIGS. 9a, b, and c three graphs of HBM Real-time I–V characteristics of NMOS devices with tests performed at +50 Volt, +100 Volt, and +200 Volt of electrostatic discharge. Voltages are displayed on the left side, currents are displayed on the right side of each graph. The tests were performed using the structure of FIG. 10. Curve 91 displays the voltage of the snapback of the NMOS and Curve 92 displays the corresponding current. Arrow 93 identifies the displacement current $I_{sub}$. In this case we assume $C_t \approx 0$ ($C_t$ is the test board capacitance). So that a constant displacement current $$C\frac{dV}{dt} = I_{dis}$$

appears at the point where the voltage (Curve 91) rises. The current $I_1$ is approximately equal to $I_{sub}$. At a high enough ESD voltage of 200 Volt (see FIG. 9c), $I_{sub}$ is proportional to the ESD voltage and follows closely that voltage as compared to the 50 Volt and 100 Volt tests (see FIG. 9a and 9b). Once the SCR/CMOS devices are built, the latch-up trigger voltage should be approximately 1.2 Volt, as mentioned earlier.

Figure 10:
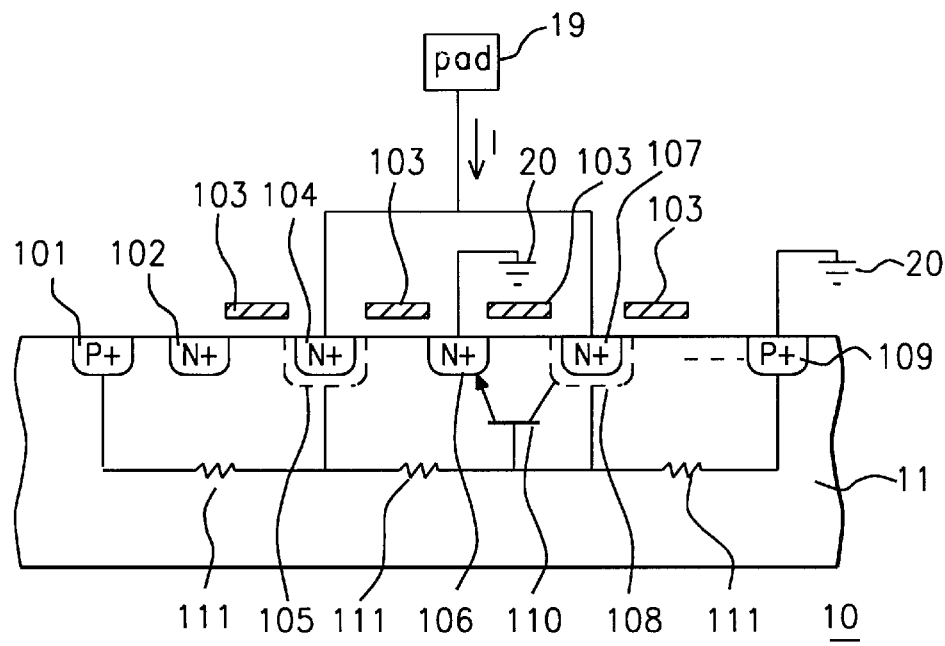
FIG. 10 is a cross-sectional view of the CMOS structures utilized to perform the HBM ESD Test.

The test structure of FIG. 10 shows in cross section a semiconductor wafer 10 with a p-substrate 11 having a number of p⁺ regions (101 and 109), n⁺ regions (102, 104, 106, and 107), gates 103, and p-substrate resistors 111. The test voltage is applied to pad 19 and current I flows to n⁺ regions 104 and 107. These two regions 104 and 107 have a junction capacitor 105 and 108, respectively. A parasitic npn bipolar transistor 110 has its emitter connected to n⁺ region 106, its collector to n⁺ region 107, and its base connected between two p-substrate resistors 111 and the junction capacitor 108. Both n⁺ region 106 and p⁺ region 109 are connected to $V_{ss}$ or ground 20.

Figure 11:
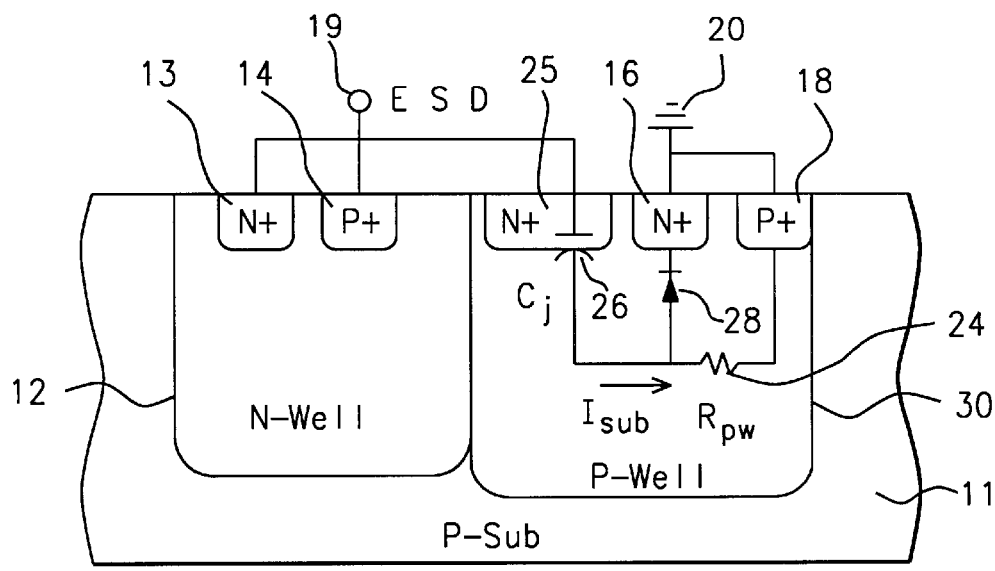
FIG. 11 is an equivalent circuit diagram of the CMOS structures of FIG. 10.

The cross-sectional diagram of FIG. 10 translates into the equivalent structural diagram of FIG. 11. FIG. 11 shows the preferred embodiment of FIG. 5, but adds the parasitic p-well resistor 24 ($R_{pw}$), between junction capacitor 26 and p⁺ contact region 18, and the equivalent junction diode 28 between junction capacitor 26 and n⁺ source 16. Note that like numerals in FIG. 5 and 11 designate the same component. The electrostatic discharge is applied to pad 19 and current $I_{sub}$ flows to p⁺ contact region 18 via capacitor 26 and p-well resistor 24. The voltage drop across resistor 24 forward biases the equivalent junction diode 28 allowing the SCR (not shown) to fire. The circuit diagram for FIG. 11 is identical to the circuit diagram of FIG. 3.

The present invention has the advantage that:
a) the trigger voltage of the parasitic SCR is about 1.2 Volt and, therefore, low enough to prevent internal device damage to oxides that are as thin as 32 Ångstrom for devices built using a 0.18 micron process, and
b) implementation of the junction capacitor is simple and does not consume valuable silicon real estate.

While the invention has been particularly shown and described with reference to the preferred embodiments thereof, it will be understood by those skilled in the art that various changes in form and details may be made without departing from the spirit and scope of the invention.

What is claimed is:

1. An electrostatic discharge (ESD) protection circuit using a parasitic silicon controlled rectifier (SCR) in a CMOS circuit, comprising:
 a semiconductor wafer with a p-substrate;
 an n-well in said p-substrate;
 an n⁺ source in said p-substrate;
 a p⁺ contact region in said p-substrate;
 said p⁺ contact region and said n⁺ source connected to a reference voltage;

a p⁺ source in said n-well;

an n⁺ contact region in said n-well;

a polysilicon capacitor disposed between said n-well and said n⁺ source to couple an AC current from an electrostatic discharge into said p-substrate;

said p⁺ source, said n⁺ contact region, and said polysilicon capacitor connected to a voltage supply;

a parasitic pnp bipolar transistor, having an emitter, a base, and a collector, said emitter, said base, and said collector formed by said p⁺ source, said n-well, and said p-substrate, respectively;

a parasitic npn bipolar transistor, having an emitter, a base, and a collector, said emitter, said base, and said collector formed by said n⁺ source, said p-substrate, and said n-well, respectively;

a first parasitic resistor created in said n-well, said first parasitic resistor extending between said first n⁺ contact region and said base of said parasitic pnp transistor;

a second parasitic resistor created by said p-substrate, said second parasitic resistor extending between said p⁺ contact region and said base of said parasitic npn transistor; and an SCR comprised of said parasitic bipolar transistors, said base of said parasitic pnp bipolar transistor connected to said collector of said parasitic npn bipolar transistor, and said collector of said parasitic pnp bipolar transistor connected to said base of said parasitic npn bipolar transistor.

2. The circuit of claim 1, wherein said SCR has a trigger voltage ranging from 1 to 12 Volts.

3. The circuit of claim 2, wherein said trigger voltage of said SCR protects internal oxides of said CMOS circuit to a thickness equal to 32 Ångstrom or more.

4. The circuit of claim 1, wherein said n⁺ source, said p⁺ contact region, and said polysilicon capacitor are deposited in a p-well in said p-substrate.

5. A method of preventing internal oxide damage to MOS devices due to electrostatic discharge, comprising the steps of:

providing a semiconductor wafer having a p-substrate;

forming an n-well in said p-substrate;

creating an n⁺ source in said p-substrate;

creating a p⁺ source in said n-well;

creating a p⁺ ground contact region next to said n+ source;

connecting said p⁺ ground contact region and said n+ source to a reference voltage;

creating a n⁺ contact region in said n-well;

creating a polysilicon capacitor disposed between said n-well and said n⁺ source to couple an AC current from an electrostatic discharge into said p-substrate;

connecting said p⁺ source, said n⁺ contact region, and said polysilicon capacitor to a voltage supply;

forming a parasitic silicon controlled rectifier (SCR) from said p-substrate, said n-well, said p⁺ source, and said p⁺ ground contact region; and triggering said SCR into conduction by a surge current caused by said electrostatic discharge.

6. The method of claim 5, wherein said surge current flowing through said polysilicon capacitor produces a voltage across a p-substrate resistance equal to or exceeding 0.7 Volt.

7. The method of claim 6, wherein said voltage causes said parasitic SCR to trigger.

8. The method of claim 5, wherein said triggering of said parasitic SCR protects said MOS devices from said internal oxide damage.

9. The method of claim 5, wherein components in said p-substrate are deposited in a p-well formed in said p-substrate.

* * * * *